United States Patent
Zhao (10) Patent No.: US 10,216,301 B2
(45) Date of Patent: Feb. 26, 2019

(54) TOUCH DISPLAY MODULE AND ELECTRONIC DISPLAY PRODUCT

(71) Applicants: BOE Technology Group Co., Ltd., Beijing (CN); Beijing BOE Optoelectronics Technology Co., Ltd., Beijing (CN)

(72) Inventor: Tingting Zhao, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 229 days.

(21) Appl. No.: 14/785,784

(22) PCT Filed: Feb. 16, 2015

(86) PCT No.: PCT/CN2015/073151
§ 371 (c)(1),
(2) Date: Oct. 20, 2015

(87) PCT Pub. No.: WO2016/074369
PCT Pub. Date: May 19, 2016

(65) Prior Publication Data
US 2016/0342250 A1    Nov. 24, 2016

(30) Foreign Application Priority Data
Nov. 10, 2014    (CN) .......................... 2014 1 0645381

(51) Int. Cl.
*H01L 27/32* (2006.01)
*H01L 51/00* (2006.01)
(Continued)

(52) U.S. Cl.
CPC ........ *G06F 3/0412* (2013.01); *G02F 1/13338* (2013.01); *G02F 1/13452* (2013.01);
(Continued)

(58) Field of Classification Search
CPC ......... G02F 1/133615; G02F 1/133524; G02F 1/13338; H03K 17/962; H03K 2217/9607; H03K 2217/960755
See application file for complete search history.

(56) References Cited

U.S. PATENT DOCUMENTS

2002/0054261 A1* 5/2002 Sekiguchi ........... G02F 1/13338
349/122
2005/0233611 A1* 10/2005 Sung ................... G02F 1/13452
439/67
(Continued)

FOREIGN PATENT DOCUMENTS

CN        102314256 A    1/2012
CN        203422720 U    2/2014
(Continued)

OTHER PUBLICATIONS

Aug. 17, 2015—(WO) ISR & WO App No. PCT/CN2015/073151.
(Continued)

*Primary Examiner* — Priyank J Shah
(74) *Attorney, Agent, or Firm* — Banner & Witcoff, Ltd.

(57) ABSTRACT

A touch display module and an electronic display product are disclosed. The touch display module includes an in-cell touch display panel and a first FPC, which includes a touch FPC section and a key FPC section; the touch FPC section is connected to a touch signal line of the in-cell touch display panel, configured for achieving a touch function of the in-cell touch display panel; the key FPC section is configured for achieving a touch function of a touch key in a non-display region. With the touch display module and the electronic display product, a touch FPC and a key FPC that are arranged in a discrete manner in the past can be integrated, reducing material and labor costs and enhancing the production efficiency.

12 Claims, 6 Drawing Sheets (51) Int. Cl.
*G02F 1/1333* (2006.01)
*G02F 1/1345* (2006.01)
*G06F 3/041* (2006.01)
*G06F 3/047* (2006.01)
*G02F 1/1335* (2006.01)

(52) U.S. Cl.
CPC .............. *G06F 3/041* (2013.01); *G06F 3/047* (2013.01); *G06F 3/0416* (2013.01); *H01L 51/0097* (2013.01); *G02F 1/133528* (2013.01); *G06F 2203/04102* (2013.01); *G06F 2203/04103* (2013.01); *H01L 27/323* (2013.01); *H01L 2251/5338* (2013.01)

(56) References Cited

U.S. PATENT DOCUMENTS

| | | | |
|---|---|---|---|
| 2009/0115743 | A1 | 5/2009 | Oowaki |
| 2010/0075720 | A1* | 3/2010 | Lee ................. G06F 1/1626 455/566 |
| 2011/0115731 | A1 | 5/2011 | Kuwajima |
| 2012/0050195 | A1* | 3/2012 | Heo .................. G06F 3/041 345/173 |
| 2012/0120018 | A1* | 5/2012 | Koh .................. G06F 3/0412 345/174 |
| 2013/0021297 | A1 | 1/2013 | Lee |
| 2013/0095885 | A1 | 4/2013 | Liu et al. |
| 2014/0253501 | A1* | 9/2014 | Noguchi .......... G02F 1/13338 345/174 |
| 2014/0320441 | A1* | 10/2014 | Yamada ............ G06F 1/1643 345/173 |
| 2014/0340348 | A1* | 11/2014 | Park ................. G06F 3/044 345/174 |
| 2015/0042901 | A1* | 2/2015 | Huang ............. G06F 3/0412 349/12 |
| 2015/0103263 | A1* | 4/2015 | Han ................. G06F 1/1643 349/12 |
| 2016/0020329 | A1* | 1/2016 | Koezuka ......... H01L 29/7869 257/43 |
| 2016/0223733 | A1* | 8/2016 | Gu .................. G02F 1/133308 |
| 2017/0063374 | A1* | 3/2017 | Yamamoto ........ H01L 51/5088 |
| 2017/0131836 | A1 | 5/2017 | Noguchi et al. |

FOREIGN PATENT DOCUMENTS

| | | |
|---|---|---|
| CN | 103927039 A | 7/2014 |
| CN | 204155244 U | 2/2015 |
| JP | 05165047 A | 6/1993 |
| JP | H0668002 U | 9/1994 |
| JP | 2009116090 A | 5/2009 |
| JP | 2011107389 A | 6/2011 |
| JP | 2014174760 A | 9/2014 |

OTHER PUBLICATIONS

Nov. 2, 2016—(CN) First Office Action 201410645381.9 with English Tran.
Jun. 28, 2017—(KR) Final Office Action Appn 10-2016-7007005 with English Tran.
Jul. 5, 2017—(CN) Second Office Action Appn 201410645381.9 with English Tran.
Dec. 7, 2016—(KR) First Office Action Appn 10-2016-7007005 with English Tran.
Aug. 17, 2017—(KR) Notice of Allowance Appn 10-2016-7007005.
May 4, 2018—(EP) Extended European Search Report Appn 15794446.3.
Oct. 15, 2018—(JP) First Office Action Appn 2017-543864.

* cited by examiner

TOUCH DISPLAY MODULE AND ELECTRONIC DISPLAY PRODUCT

The application is a U.S. National Phase Entry of International Application No. PCT/CN2015/073151 filed on Feb. 16, 2015, designating the United States of America and claiming priority to Chinese Patent Application No. 201410645381.9, filed on Nov. 10, 2014. The present application claims priority to and the benefit of the above-identified applications and the above-identified applications are incorporated by reference herein in their entirety.

TECHNICAL FIELD

Embodiments of the present invention relate to a touch display module and an electronic display product.

BACKGROUND

Flexible circuit boards (briefly called as soft plates or FPCs) are a kind of printed circuit boards with high reliability and excellent flexibility, are made with a polyimide or polyester thin film as a base material, have the advantages of high wiring density, light weight and thin thickness, and are mainly used in cell phones, notebook computers, PDAs, digital cameras and other products.

Figure 1:
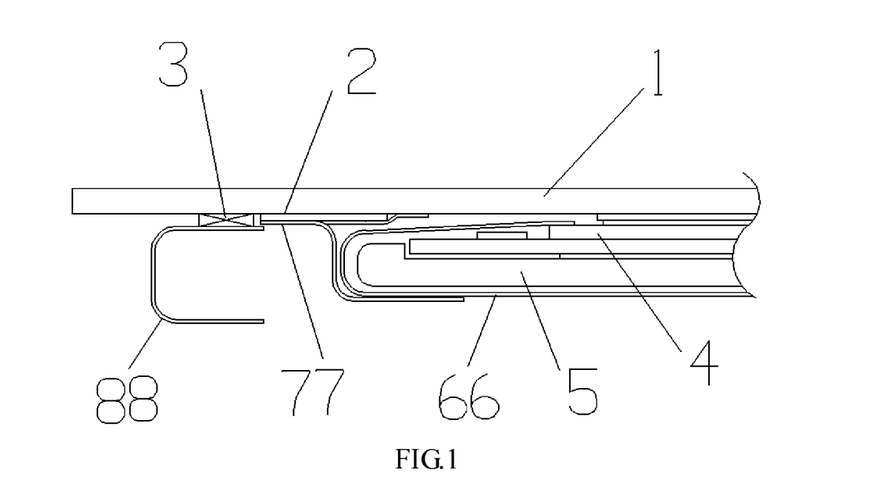
FIG. 1 is a schematically sectional view illustrating an in-cell touch module of a cell phone.

A usual product employing an in-cell touch display panel, such as a cell phone, or the like, as illustrated in FIG. 1, mainly includes a touch FPC 66 (for applying touch signals of an in-cell liquid crystal cell), a key FPC 77 (for applying touch signals of a key), and a key lamp FPC 88 (for providing the key with light source). The touch FPC 66 and the key FPC 77 are generally designed and manufactured by module manufactures and assembled onto a touch display module, while the key lamp FPC 88 is designed and manufactured by cell-phone manufactures and assembled onto a case.

In the background of rapid update of products employing in-cell touch display panels, such as cell phones or the like, at present, such a manner, in which touch FPCs 66, key FPCs 77 and key lamp FPCs 88 are designed and manufactured by different manufactures, respectively and then assembled together to realize touch function and key function, cannot meet requirements of low cost and high production efficiency already.

SUMMARY

According to embodiments of the present invention, there are provided a touch display module and an electronic display product, capable of integrating a touch FPC and a key FPC that are arranged in a discrete manner in the past, so that material and labor costs are reduced, and the production efficiency is enhanced.

According to at least an embodiment of the present invention, there is provided a touch display module, which includes an in-cell touch display panel and a first FPC, with functions of a touch FPC and a key FPC being integrated on the first FPC, namely, the first FPC includes a touch FPC section and a key FPC section; the touch FPC section is connected to a touch signal line of the in-cell touch display panel, configured for achieving a touch-control function of the in-cell touch display panel; and the key FPC section is configured for achieving a touch-control function of a touch key in a non-display region.

For example, the first FPC also has a key lamp FPC integrated thereon, namely, the first FPC further includes a key lamp FPC section, and the key lamp FPC section includes a key lamp and wirings connected to the key lamp.

For example, the touch display module further includes a light guide sheet, and the key lamp and the light guide sheet act to provide a uniform backlight to the touch key; and the key lamp is disposed on the long side or the short side of the light guide sheet.

For example, the first FPC includes a bonding zone, a touch functional area, a wiring zone, a bending zone, a component zone and a joint zone that are connected with each other.

For example, a terminal connected to a touch signal line of the in-cell touch display panel is provided within the bonding zone; a functional module of the touch key is provided within the touch functional zone; and a terminal for outputting a signal is provided within the joint zone.

For example, the bonding zone is disposed on one side of the touch functional zone.

For example, the first FPC is turned down at the bending zone, and the component zone is assembled to a back side of the in-cell touch display panel.

For example, the wiring zone, the bending zone, the component zone and the joint zone are sequentially connected with each other, and connected with the bonding zone and the touch functional zone, respectively.

For example, the touch display module further includes a second FPC, which is connected to a display signal line of the in-cell touch display panel, configured for achieving a display function of the in-cell touch display panel; the first FPC is connected to the second FPC through a terminal at the joint zone.

For example, the in-cell touch display panel is an in-cell liquid crystal display panel or an in-cell organic light-emitting display panel.

According to the embodiment, there is further provided an electronic display product, which includes any one of the aforesaid touch display modules.

BRIEF DESCRIPTION OF THE DRAWINGS

In order to illustrate the technical solution in the embodiments of the invention more clearly, the drawings needed to be used in the embodiments will be briefly introduced below; it is obvious that the drawings as described below are only related to some embodiments of the invention, but are not limitative of the invention.

REFERENCE NUMERALS

1—cover plate, 2—light guide sheet, 3—key lamp, 4—in-cell touch display panel, 5—backlight source, 6—touch FPC section, 7—key FPC section, 8—key lamp FPC section, 9—secondary FPC (first FPC), 90—bonding zone, 91—touch function zone, 92—wiring section, 93—bending zone, 94—component zone, 95—joint zone, 10—primary FPC (second FPC), 66—touch FPC, 77—key FPC, 88—key lamp FPC.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

It is to be noted that, in the following description about embodiments of the invention, a secondary FPC refers to a first FPC, and a primary FPC refers to a secondary FPC.

Unless otherwise defined, the technical terminology or scientific terminology used herein should have the same meaning as commonly understood by one of ordinary skill in the art to which this invention belongs. "First", "second" and the like used in the present disclosure do not show any order, number or importance, but are only used to distinguish different constituent parts.

According to embodiments of the present invention, there are provided a touch display module and an electronic display product, capable of integrating a touch FPC, a key FPC and a key lamp FPC that are arranged together in a discrete manner in the past, or integrating a touch FPC and a key FPC together if no key lamp is included in the product design, which reduces material and labor costs, and enhances the production efficiency.

According to an embodiment of the invention, there is provided a touch display module, which includes an in-cell touch display panel and a secondary FPC including a touch FPC section and a key FPC section, namely, functions of touch FPC and key FPC are integrated into the secondary FPC. The touch FPC section of the secondary FPC of the present embodiment is connected to a touch signal line of the in-cell touch display panel, for achieving a touch function of the in-cell touch display panel; and the key FPC section of the secondary FPC of the present embodiment is configured for achieving a touch function of a touch key in a non-display region.

Touch-panel terminal equipments, such as cell phones, watches, tablet computers, electronic books, personal digital assistants or the like mainly adopt such a configuration that a touch FPC, a key FPC and a key lamp FPC are discretely arranged. The touch FPC and the key FPC may be generally designed and manufactured by a module manufacture and assembled onto a touch display module, while the key lamp FPC is designed and manufactured by a product manufacture and assembled onto a housing. Functions of a touch FPC and a key FPC are integrated into a secondary FPC of the present embodiment, and if a key lamp is further included in the product design, then further, a key lamp FPC may further be integrated into the secondary FPC. That is, the secondary FPC further includes a key lamp FPC section, and the key lamp FPC section includes a key lamp and wirings connected to the key lamp, and the key lamp is configured for providing a touch key with a backlight. For the touch display module provided by embodiments of the invention, the integration degree is high, and only one assembly procedure is required, thereby the material and labor costs are reduced, and the production efficiency is enhanced.

In order that the structure of a touch display module provided by embodiments of the invention is better understood by those skilled in the art, hereinafter, taking a cell phone as an example, technical solutions provided by the present invention will be described in detail through specific embodiments. For convenience of understanding, technical solutions for comparison will also be described as well in the following descriptions.

FIG. 1 is a touch display module suitable for a cell phone, serving as a technical solution for comparison, and its main constituent components include a cover plate 1, an in-cell touch display panel 4 (such as a liquid crystal panel, which includes a liquid crystal cell, polarization sheets and a chip IC, briefly called as COGA), a display-panel backlight 5, a primary FPC (not shown in the figure, for achieving a display function of the display panel), a touch FPC 66, a key FPC 77, and a key lamp FPC 88. The key lamp FPC 88 includes a key lamp 3 and wirings connected to the key lamp. The touch display module further includes a light guide sheet 2, and the key lamp 3 and the light guide sheet 2 provide a uniform backlight for a touch key. The assembling process of the in-cell touch module of the cell phone as illustrated in FIG. 1 is as follows: the touch FPC 66 is pressed onto the liquid crystal panel (COGA), the key FPC 77 is stuck to the light guide sheet 2 and then connected to the touch FPC 66 by welding or by a connector; and the key lamp FPC 88 is separately designed, independently assembled onto a housing of the cell phone and then connected to a mainboard of the cell phone by welding or by a connector.

Figure 2:
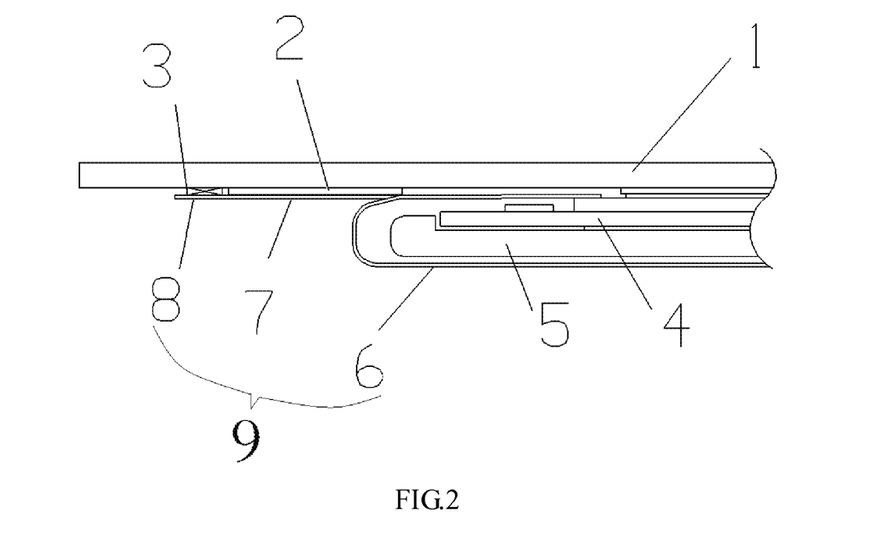
FIG. 2 shows a first structure of a touch module provided by an embodiment of the invention.

FIG. 2 illustrates a first touch display module structure, suitable for a cell phone, provided by an embodiment of the invention, and the main constituent components include a cover plate 1, an in-cell touch display panel 4 (such as a liquid crystal panel (COGA), including a liquid crystal cell, polarization sheets and a chip IC), a display-panel backlight 5, a primary FPC (i.e., a second FPC, not shown in the figure) and a secondary FPC 9 (i.e., a first FPC). Functions of a touch FPC, a key FPC and a key lamp FPC are integrated onto the secondary FPC 9, namely, the secondary FPC 9 includes a touch FPC section 6, a key FPC section 7 and a key lamp FPC section 8.

For example, the touch FPC section 6 is connected to a touch signal line of the in-cell touch display panel 4, configured for achieving a touch control function of the in-cell touch display panel 4; the key FPC section 7 is configured for achieving a touch control function of a touch key in a non-display region; and the key lamp FPC section 8 includes a key lamp 3 and wirings connected to the key lamp 3. The touch display module further includes a light guide sheet 2, and the key lamp 3 and the light guide sheet 2 provide a uniform backlight to a touch key.

Figure 3:
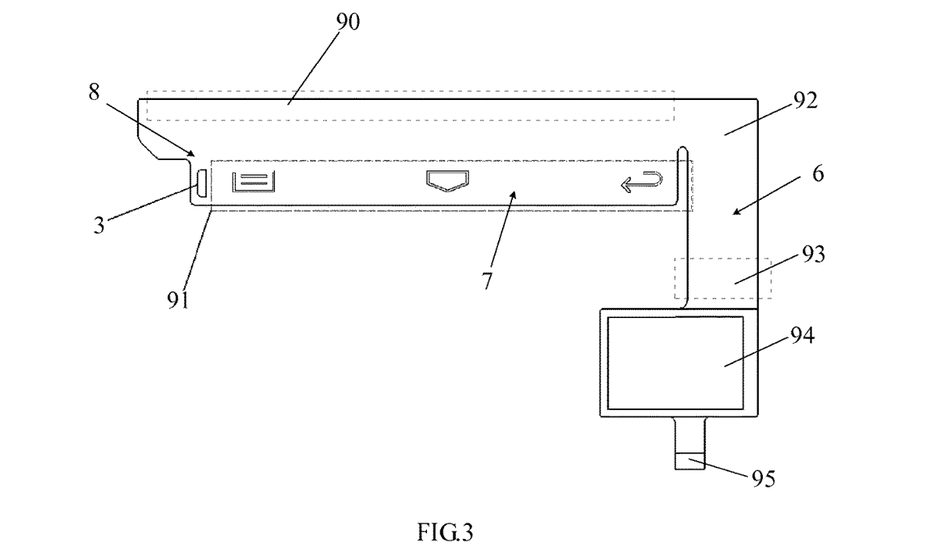
FIG. 3 is a first structural plan view illustrating a secondary FPC of the first structure as illustrated in FIG. 2.
Figure 4:
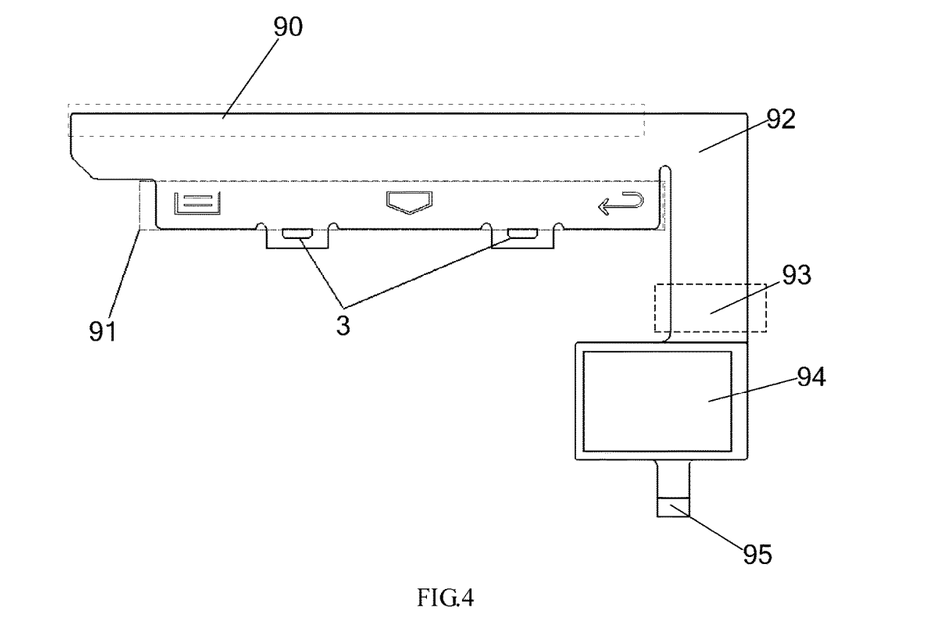
FIG. 4 is a second structural plan view illustrating a secondary FPC of the first structure as illustrated in FIG. 2.

For example, functions of a touch FPC, a key FPC and a key lamp FPC are integrated onto the secondary FPC 9, and as illustrated in FIG. 3 and FIG. 4, the secondary FPC 9 includes: a bonding zone 90, a touch functional zone 91, a wiring zone 92, a bending zone 93, a component zone 94 and a joint zone 95 that are connected with each other. Terminals for connecting with touch signal lines of the in-cell touch display panel 4 are provided within the bonding zone 90; a functional module of touch key is provided within the touch functional zone 91; a touch chip and relevant components/devices are provided within the component zone 94; and terminals for outputting signals are provided within the joint zone 95. The key lamp 3 may be set on the long side of the light guide sheet 2 as illustrated in FIG. 3, or set on the short side of the light guide sheet 2 shown in FIG. 4. The secondary FPC 9 is turned down at the bending zone 93, and the component 94 is assembled on the back side of the in-cell touch display panel 4.

It can be understood by those skilled in the art that, arrangement positions of the above bonding zone 90, the touch functional zone 91, the wiring zone 92, the bending zone 93, the component zone 94 and the joint zone 95 on the secondary FPC 9 can be set according to actual circumstances by those skilled in the art in practice, and those as illustrated in FIG. 3 and FIG. 4 are merely used for explanation and illustration, but not for limitation. For example, the bonding zone 90 is disposed on one side of the touch functional zone 91, and for example, it is disposed above the touch functional zone 91; the bonding zone 92, the bending zone 93, the component zone 94 and the joint zone 95 are bonded with each other in sequence, and bonded to the bonding zone 90 and the touch functional zone 91, respectively. Wirings branched out from the bonding zone 90 and the touch functional zone 91 are routed on the wiring zone 92, and then enter the component zone 94 and the joint zone 95.

A touch display module useful for cell phones is provided by an embodiment of the invention, and a secondary FPC 9 includes a key FPC section 7, a key lamp section FPC 8 and a touch FPC section 6. That is, the key FPC, the key lamp FPC and the touch FPC are integrated to form the secondary FPC 9 and assembled on a module, and a section with a key function on the secondary FPC 9 is not bended, so that assembling procedures can be reduced. For example, the assembling method is as follows: the secondary FPC 9 and a liquid crystal panel (COGA) as the in-cell touch display panel 4 are pressed and connected together by a pressing equipment; a cover plate 1 and the liquid crystal panel (with the secondary FPC 9 pressed thereon) are pressed together via OCA/OCR/sealant; the secondary FPC 9 is stuck to a light guide sheet 2 of the cover plate 1; and a key lamp 3 (LED) is stuck to the cover plate. Here, the OCA (optically clear adhesive) is a solid, transparent optical adhesive, and the OCR (optically clear resin) is a liquid, optical resin or ultraviolet hardening resin, commonly referred to as water glue, and may also be called as a liquid, transparent optical adhesive (LOCA).

Figure 5:
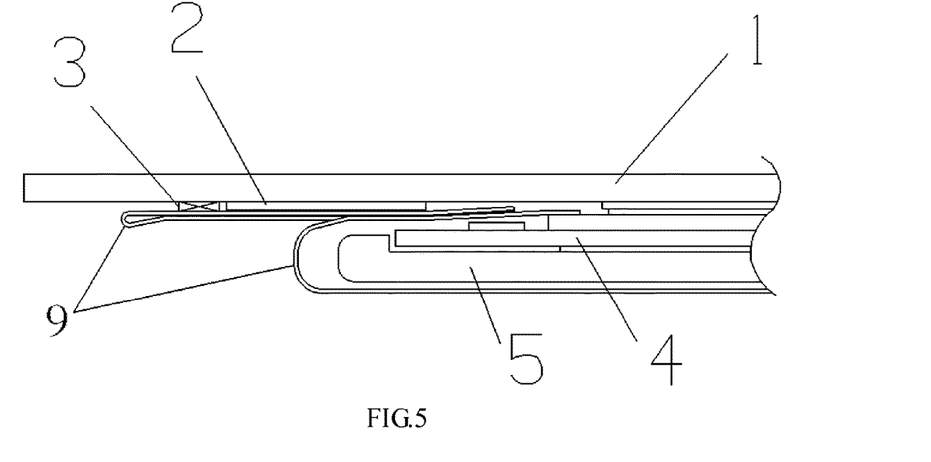
FIG. 5 shows a second structure of a touch module provided by an embodiment of the invention.
Figure 6:
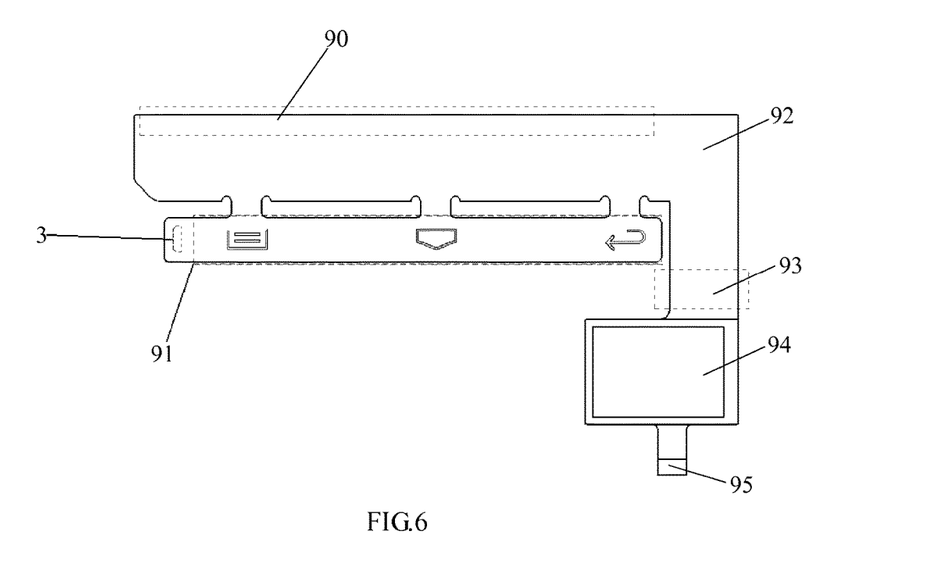
FIG. 6 is a first structural plan view illustrating a secondary FPC of the second structure as illustrated in FIG. 5.
Figure 7:
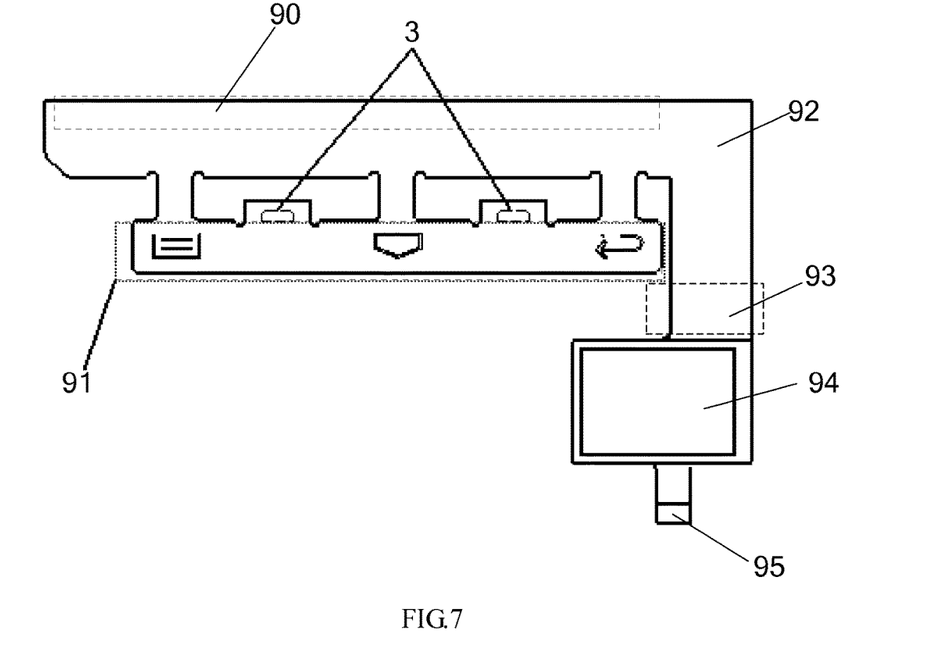
FIG. 7 is a second structural plan view illustrating a secondary FPC of the second structure as illustrated in FIG. 5.

FIG. 5 illustrates a second touch display module structure, suitable for a cell phone, provided by an embodiment of the invention, and similarly the main constituent components include a cover plate 1, a liquid crystal panel as an in-cell touch display panel 4, a display-panel backlight source 5, a primary FPC (not illustrated in the drawing), and a secondary FPC 9. Functions of a touch FPC, a key FPC and a key lamp FPC are integrated onto the secondary FPC 9, namely, the secondary FPC 9 includes a key FPC section 7, a key lamp section FPC 8 and a touch FPC section 6. It differs from the first structure in that, a touch functional zone 91 is bended to the front side (one side for watching) of the secondary FPC 9 in the touch module adopted by the present invention. FIG. 6 and FIG. 7 illustrate structural plan views illustrating secondary FPCs 9 in the second structure, a key lamp 3 in FIG. 6 is disposed on the short side of a light guide sheet 2, and a key lamp 3 in FIG. 7 is disposed on the long side of a light guide sheet 2. With schemes of the second structure, the distance between an edge of the A.A zone (i.e., a display region) and a touch key can be shortened.

For example, the assembling method is as follows: a secondary FPC 9 and a liquid crystal panel as the in-cell touch display panel 4 are pressed and connected together by a pressing equipment; a touch functional zone 91 of the secondary FPC 9 is turned down and stuck to the main body of the secondary FPC 9; a cover plate 1 and the liquid crystal panel (with the secondary FPC 9 pressed thereon) are pressed together via OCA/OCR/sealant; the secondary FPC 9 is stuck to a light guide sheet 2 of the cover plate 1; and a key lamp 3 is stuck to the cover plate 1.

Figure 8:
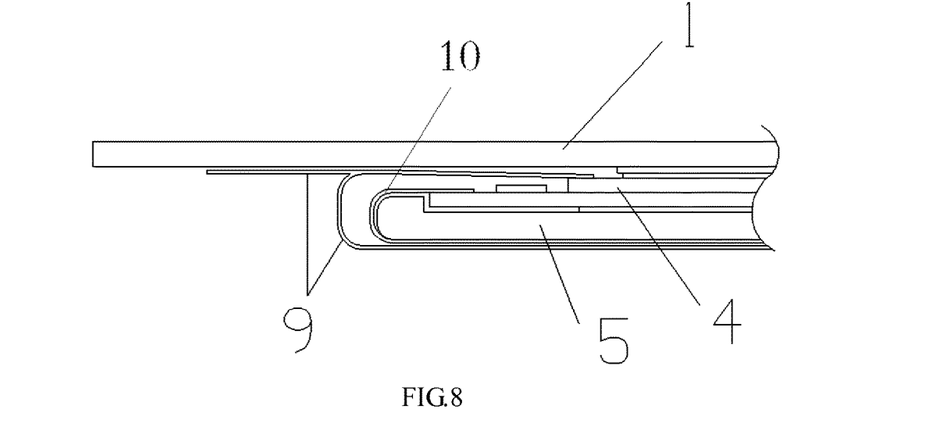
FIG. 8 shows a third structure of a touch module provided by an embodiment of the invention.

FIG. 8 illustrates a third touch display module structure, suitable for a cell phone, provided by an embodiment of the invention, and the main constituent components likewise include a cover plate 1, a liquid crystal panel as an in-cell touch display panel 4, a display-panel backlight source 5, a primary FPC 10, and a secondary FPC 9. It differs from the first structure in that, the touch display module adopted in the present embodiment does not comprise a key lamp, and only functions of a key FPC and a touch FPC are integrated onto the secondary FPC 9, namely, the secondary FPC 9 includes a key FPC section 7 and a touch FPC section 6, and section of a touch functional zone 91 of the secondary FPC 9 is not bended, so that it is suitable for an in-cell touch display module without key. Thus, assembling procedures can be cut down, and the material cost can be reduced.

Figure 9:
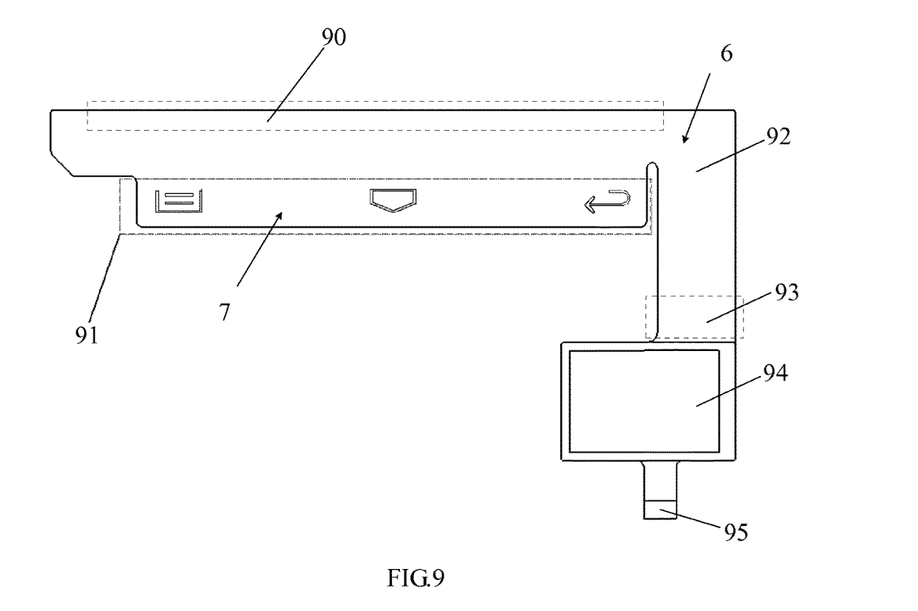
FIG. 9 is a structural plan view illustrating a secondary FPC of the third structure as illustrated in FIG. 8.

FIG. 9 illustrates a structural plan view illustrating a secondary FPC 9 of the third structure. The assembling method of the structure 3 may be as follows: a secondary FPC 9 and a liquid crystal panel are pressed and connected together by a pressing equipment; and a cover plate 1 and the liquid crystal panel (with the secondary FPC 9 pressed thereon) are pressed together via OCA/OCR/sealant.

Figure 10:
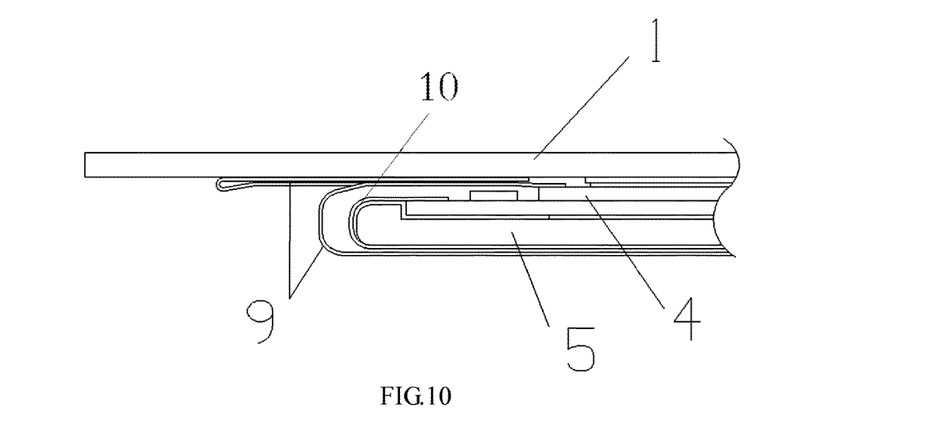
FIG. 10 shows a fourth structure of a touch module provided by an embodiment of the invention.

FIG. 10 illustrates a fourth touch display module structure, suitable for a cell phone, provided by an embodiment of the invention, and similarly the main constituent components include: a cover plate 1, a liquid crystal panel as an in-cell touch display panel 4, a display-panel backlight source 5, a primary FPC 10, and a secondary FPC 9. The touch display module adopted in the present embodiment does not comprise a key lamp, either, and only functions of a key FPC and a touch FPC are integrated onto the secondary FPC 9 likewise. That is, the secondary FPC 9 includes a key FPC section 7 and a touch FPC section 6, and is suitable for an in-cell touch display module without any key.

Figure 11:
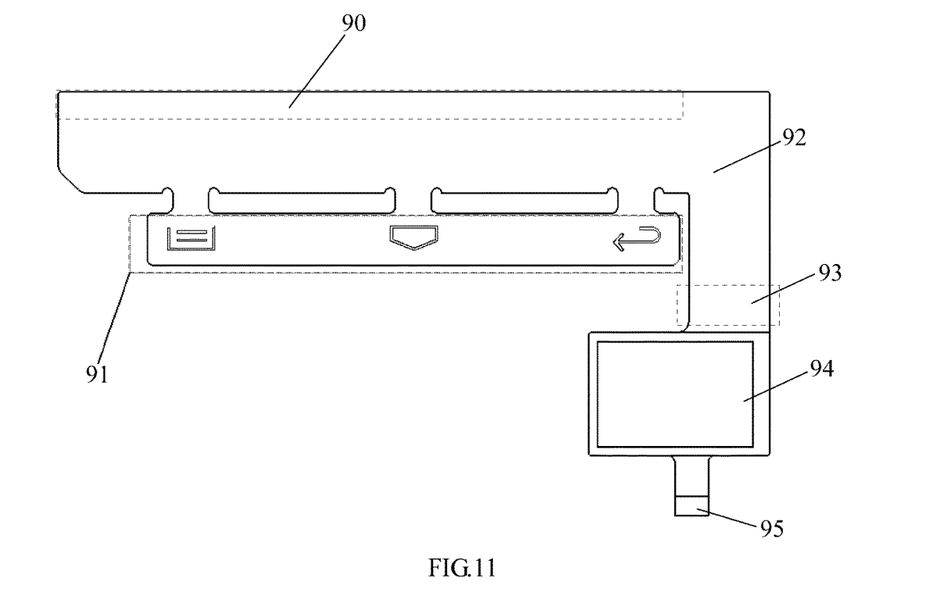
FIG. 11 is a structural plan view illustrating a secondary FPC of the fourth structure as illustrated in FIG. 10.

FIG. 11 illustrates a structural plan view illustrating a secondary FPC of the fourth structure. It differs from the third structure in that, a section of a touch functional zone 91 is bended to the front side of the secondary FPC 9. Thus, the material cost can be reduced to the maximum extent, and the distance between an edge of an A.A region and a touch key is shortened. The assembling method is as follows: a secondary FPC 9 and a liquid crystal panel are pressed and connected together by a pressing equipment; a touch functional zone of the secondary FPC 9 is turned down and then stuck to the main body of the secondary FPC 9; a cover plate 1 and the liquid crystal panel (with the secondary FPC 9 pressed thereon) are pressed together via OCA/OCR/sealant; and the secondary FPC 9 is stuck a light guide sheet 2 of the cover plate 1.

Further, the primary FPC 10 included by the above touch display module (see FIG. 8 and FIG. 10) is connected to a display signal line of the in-cell touch display panel 4, configured for achieving a display function of the in-cell touch display panel 4; and the secondary FPC 9 is connected to the primary FPC through terminals of a joint zone 95.

In addition, the present embodiment does not set a limit to the displaying mode of any above-mentioned in-cell touch display panel, and for example, it may be an in-cell liquid crystal display panel, or an in-cell organic light-emitting display panel.

Embodiments of the invention are to provide specific touch display modules suitable for cell phones. As compared with a common in-cell touch display module, an integral design is useful for the secondary FPC 9 of embodiments of the invention, which integrates a touch FPC, a key FPC and a key lamp FPC of a common in-cell touch display module, or only integrates a touch FPC and a key FPC, and the same function as a conventional module is realized by reasonable assembly.

Effects of embodiments of the present invention include: the number of FPCs can be effectively reduced, so that the costs of FPCs are saved, and meanwhile assembling procedures are decreased, so that the production efficiency and the yield can be effectively enhanced.

It is to be noted that, technical solutions of embodiments of the invention are not only suitable for FPC design of a cell phone, but also suitable for FPC design of touch-panel terminal equipments such as watches, tablet computers, electronic books, personal digital assistants, and so on.

The secondary FPC of embodiments of the invention integrates functions of a touch FPC, a key FPC and a key lamp FPC, but its specific profile is not limited to those described in the examples. The secondary FPC may also be designed in other regular patterns or irregular patterns, and may also be changed according to the number of LEDs and specific circumstances of the placement, and component placement, wiring design and the like on the secondary FPC can also be changed according to specific circumstances, and shall not be limited to the forgoing descriptions.

According to an embodiment of the invention, there is further provided an electronic product, which includes any of the above-mentioned touch display modules. The electronic product provided by embodiments of the invention has a high integration level and a low cost. The display device may be a liquid crystal display, an electronic paper, an OLED display, a cell phone, a watch, a tablet computer, a television, a display, a notebook computer, a digital photo frame, a navigator or any other product or component having a display function.

Various embodiments in this specification are each described in a progressive manner, and the same or similar parts between various embodiments may refer to each other.

With the touch display module and the electronic display product provided by embodiments of the invention, a touch FPC, a key FPC and a key lamp FPC that are arranged in a discrete manner in the past can be integrated, or if no key lamp is included in the product design, then a touch FPC and a key FPC are integrated, which reduces the material cost. Meanwhile, in terms of assembling procedure in production, if a touch FPC, a key FPC and a key lamp FPC that are independent are used, then they require three assembly procedures that are separately conducted in different manufactures. While embodiments of the invention are simplified into one integrative secondary FPC, and so, only one assembly procedure is required. Thus, the labor cost is reduced, and the production efficiency is enhanced.

The protection scope of the invention shall be defined by the protection scope of claims.

This patent application claims the benefit of priority from Chinese patent application No. 201410645381.9, filed on Nov. 10, 2014, the disclosure of which is incorporated herein in its entirety by reference as a part of the present application.

What is claimed is:

1. A touch display module, comprising an in-cell touch display panel and a first flexible printed circuit (FPC), wherein, the first FPC comprises a touch FPC section and a key FPC section, the touch FPC section is connected to a touch signal line of the in-cell touch display panel and configured for achieving a touch-control function of the in-cell touch display panel, and the key FPC section is configured for achieving a touch-control function of a touch key in a non-display region, the first FPC further comprises a key lamp FPC section, wherein the touch FPC section, the key FPC section, and the key lamp FPC section are integrated with each other, and the key lamp FPC section comprises a key lamp and wiring connected to the key lamp, the key FPC section comprises a touch functional zone, and the touch functional zone is bended to a watching side of the first FPC so as to overlap with at least a portion of sections other than the key FPC section, and a portion of the touch FPC section is bended to a back side of the first FPC, opposite to the watching side of the first FPC.

2. The touch display module of claim 1, further comprising a light guide sheet, wherein, the key lamp and the light guide sheet act, during operation, to provide a uniform backlight to the touch key, and the key lamp is disposed on a long side or a short side of the light guide sheet.

3. The touch display module of claim 2, wherein, the in-cell touch display panel is an in-cell liquid crystal display panel or an in-cell organic light-emitting display panel.

4. The touch display module of claim 1, wherein, the in-cell touch display panel is an in-cell liquid crystal display panel or an in-cell organic light-emitting display panel.

5. An electronic display product, comprising the touch display module of claim 1.

6. A touch display module, comprising an in-cell touch display panel and a first flexible printed circuit (FPC), wherein, the first FPC comprises a touch FPC section and a key FPC section, the touch FPC section and the key FPC section are integrated with each other, the touch FPC section is connected to a touch signal line of the in-cell touch display panel and configured for achieving a touch-control function of the in-cell touch display panel, and the key FPC section is configured for achieving a touch-control function of a touch key in a non-display region, wherein, the first FPC comprises a bonding zone, a touch functional zone, a wiring zone, a bending zone, a component zone and a joint zone that are connected with each other, the touch FPC section comprises the bonding zone, the wiring zone, the bending zone, the component zone and the joint zone, and the key FPC section comprises the touch functional zone, a terminal connected to the touch signal line of the in-cell touch display panel is provided within the bonding zone, a functional module of the touch key is provided within the touch functional zone, a touch chip is provided within the component zone, and a terminal for outputting a signal is provided within the joint zone, and wherein the touch functional zone is bended to a watching side of the first FPC so as to overlap with at least a portion of sections other than the key FPC section; and the component zone and the joint zone are bended to a back side of the first FPC, opposite to the watching side of the first FPC.

7. The touch display module of claim 6, wherein, the bonding zone is disposed on one side of the touch functional zone.

8. The touch display module of claim 6, wherein the first FPC is turned down at the bending zone, and the component zone is assembled to a back side of the in-cell touch display panel.

9. The touch display module of claim 6, wherein, the wiring zone, the bending zone, the component zone and the joint zone are sequentially connected with each other, and connected with the bonding zone and the touch functional zone.

10. The touch display module of claim 6, further comprising a second FPC, wherein, the second FPC is connected to a display signal line of the in-cell touch display panel and configured for achieving a display function of the in-cell touch display panel, and the first FPC is connected to the second FPC through a terminal at the joint zone.

11. The touch display module of claim 6, wherein, the in-cell touch display panel is an in-cell liquid crystal display panel or an in-cell organic light-emitting display panel.

12. An electronic display product, comprising the touch display module of claim 6.

* * * * *